United States Patent
Collins et al.

(10) Patent No.: US 10,170,337 B2
(45) Date of Patent: Jan. 1, 2019

(54) IMPLANT AFTER THROUGH-SILICON VIA (TSV) ETCH TO GETTER MOBILE IONS

(71) Applicant: International Business Machines Corporation, Armonk, NY (US)

(72) Inventors: Christopher Collins, Wappingers Falls, NY (US); Mukta G. Farooq, Hopewell Junction, NY (US); Troy L. Graves-Abe, Wappingers Falls, NY (US); Brian J. Greene, Fishkill, NY (US); Robert Hannon, Wappingers Falls, NY (US); Herbert L. Ho, Cornwall, NY (US); Chandrasekharan Kothandaraman, New York, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 122 days.

(21) Appl. No.: 14/994,598

(22) Filed: Jan. 13, 2016

(65) Prior Publication Data

US 2017/0200620 A1    Jul. 13, 2017

(51) Int. Cl.
*H01L 21/322*     (2006.01)
*H01L 21/768*     (2006.01)
(Continued)

(52) U.S. Cl.
CPC ........ *H01L 21/3226* (2013.01); *H01L 21/308* (2013.01); *H01L 21/76879* (2013.01);
(Continued)

(58) Field of Classification Search
CPC ............. H01L 21/308; H01L 21/76879; H01L 21/76898; H01L 23/5226; H01L 23/528;
(Continued)

(56) References Cited

U.S. PATENT DOCUMENTS

2008/0268624 A1* 10/2008 Kwak ............... H01L 21/26506
                                                    438/527
2009/0273034 A1* 11/2009 Woon ................ H01L 21/26506
                                                    257/368
(Continued)

FOREIGN PATENT DOCUMENTS

JP          07-273121      * 10/1995    ........... H01L 21/322

OTHER PUBLICATIONS

Kothandaraman, C. et al.; "Through Silicon Via (TSV) Effects on Devices in Close Proximity—The Role of Mobile Penetration—Characterization and Mitigation"; IEEE; p. 14.6.1-14.6.3; 2014.

*Primary Examiner* — William F Kraig
*Assistant Examiner* — Khatib Rahman
(74) *Attorney, Agent, or Firm* — Cantor Colburn LLP; Steven Meyers

(57) ABSTRACT

A method of making a semiconductor device includes disposing a mask on a substrate; etching the mask to form an opening in the mask; etching a trench in the substrate beneath the opening in the mask; and implanting a dopant in an area of the substrate beneath the opening of the mask, the dopant capable of gettering mobile ions that can contaminate the substrate; wherein the dopant extends through the substrate from a sidewall of the trench and an endwall of the trench.

14 Claims, 6 Drawing Sheets

(51) Int. Cl.
  *H01L 21/308* (2006.01)
  *H01L 29/167* (2006.01)
  *H01L 23/522* (2006.01)
  *H01L 23/528* (2006.01)
  *H01L 23/532* (2006.01)
  *H01L 21/265* (2006.01)

(52) U.S. Cl.
  CPC ...... *H01L 21/76898* (2013.01); *H01L 23/528* (2013.01); *H01L 23/5226* (2013.01); *H01L 23/53214* (2013.01); *H01L 23/53228* (2013.01); *H01L 23/53257* (2013.01); *H01L 29/167* (2013.01); *H01L 21/26586* (2013.01)

(58) Field of Classification Search
  CPC ......... H01L 23/53214; H01L 23/53228; H01L 23/53257
  See application file for complete search history.

(56) References Cited

U.S. PATENT DOCUMENTS

| | | | |
|---|---|---|---|
| 2010/0267184 A1* | 10/2010 | Noh | H01L 21/26506 438/58 |
| 2011/0049717 A1 | 3/2011 | West | |
| 2011/0110062 A1* | 5/2011 | Park | H01L 23/26 361/783 |
| 2011/0187000 A1 | 8/2011 | West | |
| 2011/0241040 A1* | 10/2011 | Yu | H01L 21/6835 257/91 |
| 2012/0292784 A1 | 11/2012 | Nishio | |
| 2013/0037922 A1* | 2/2013 | Arriagada | H01L 21/2007 257/652 |
| 2013/0113103 A1 | 5/2013 | West et al. | |
| 2014/0319694 A1* | 10/2014 | Graves-Abe | H01L 21/76898 257/774 |
| 2015/0325642 A1* | 11/2015 | Yang | H01L 29/7802 438/268 |

* cited by examiner

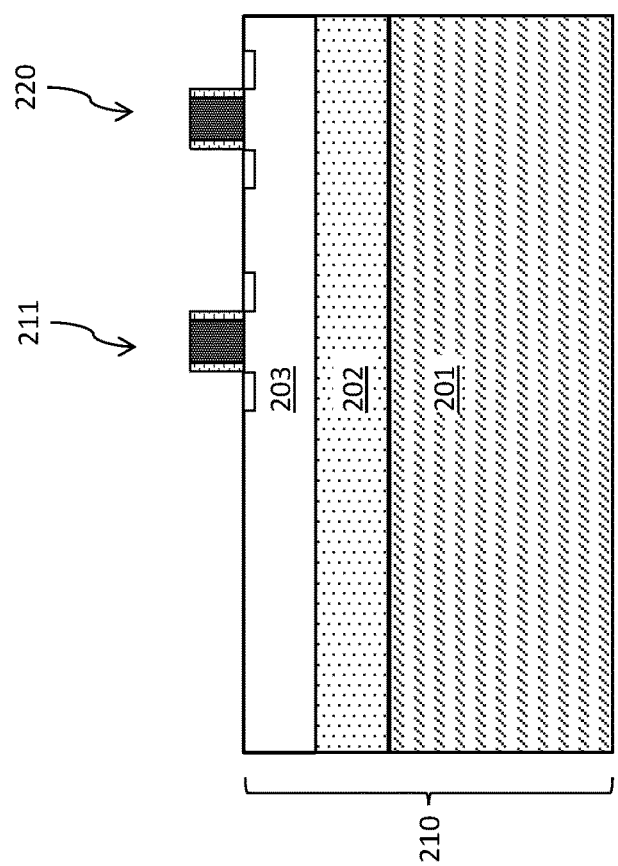
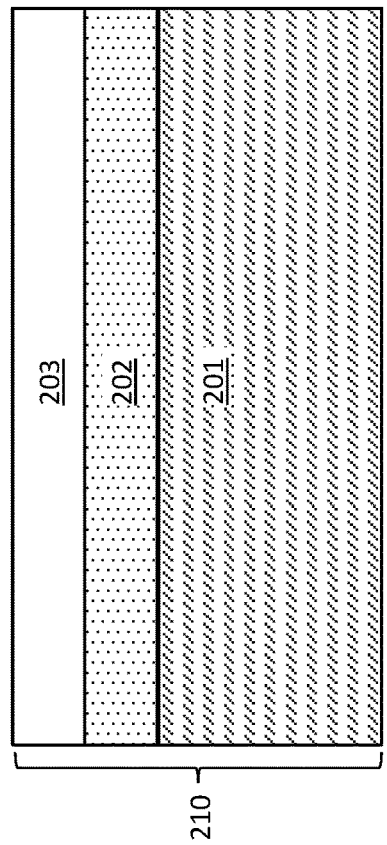
FIG. 2B
FIG. 2A

IMPLANT AFTER THROUGH-SILICON VIA (TSV) ETCH TO GETTER MOBILE IONS

BACKGROUND

The present invention relates to three-dimensional (3D) chip assemblies, and more specifically, to TSV implants in 3D chip assemblies.

Advancements in the area of semiconductor fabrication have enabled the manufacturing of integrated circuits with a high density of electronic components. However, the increasing numbers and lengths of interconnect wirings may cause an increase in circuit resistance-capacitance delay and power consumption, which may impact circuit performance. Three-dimensional (3D) stacking of integrated circuits address these challenges.

Fabricating 3D integrated circuits includes vertically stacking at least two silicon wafers. Vertically stacking the wafers may reduce interconnect wiring length and increase semiconductor device density. Deep through-silicon/substrate vias (TSVs) may be formed to provide interconnections and electrical connectivity between the electronic components of the 3D integrated circuits. Such TSVs may have high aspect ratios, in which the via height is large with respect to the via width, to save valuable area in an integrated circuit design. Therefore, semiconductor device density may be increased, and total length of interconnect wiring may be decreased by incorporating TSVs in 3D integrated circuits.

In order to form an electrical connection between the components of two silicon wafers stacked one on top of the other, a TSV may extend through the entire thickness of a single wafer. More specifically, a TSV may extend through multiple interconnect levels and through a semiconductor substrate in which semiconductor devices may be formed. The interconnect levels may generally be located above the substrate and include multiple connections to and between the devices formed in the substrate. To form the TSV, a deep trench is etched into the wafer through the interconnect levels and the substrate.

SUMMARY

According to an embodiment, a method of making a semiconductor device includes disposing a mask on a substrate; etching the mask to form an opening in the mask; etching a trench in the substrate beneath the opening in the mask; and implanting a dopant in an area of the substrate beneath the opening of the mask, the dopant capable of gettering mobile ions that can contaminate the substrate; wherein the dopant extends through the substrate from a sidewall of the trench and an endwall of the trench.

According to another embodiment, a method of making a semiconductor device includes disposing a mask on a substrate; etching the mask to form an opening in the mask; etching a trench in the substrate beneath the opening in the mask; performing a first implantation technique to introduce a dopant in a first area of the substrate beneath the opening of the mask, the dopant capable of gettering mobile ions that can contaminate the substrate; performing a second implantation technique to introduce a dopant in a second area of the substrate beneath the opening of the mask, a portion of the second area being different than the first area, and the dopant capable of gettering mobile ions that can contaminate the substrate; wherein the dopant extends through the substrate from a sidewall of the trench and an endwall of the trench.

According to another embodiment, a semiconductor device, comprising a substrate; a trench extending from a surface of the substrate to a depth within the substrate; a dopant arranged within the substrate and extending from a sidewall of the trench and an endwall of the trench, the dopant capable of gettering mobile ions that can contaminate the substrate; and a conductive material disposed within the trench.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 2A-9 illustrate exemplary methods of making semiconductor structures according to various embodiments, in which:

FIG. 2A is a cross-sectional side view of a substrate;

FIG. 2B is a cross-sectional side view after forming transistors on the substrate;

FIG. 3 is a cross-sectional side view after disposing a mask on the substrate;

FIG. 4 is a cross-sectional side view after etching the mask;

FIG. 5 is a cross-sectional side view after introducing a dopant into the substrate using a first implantation method;

FIG. 6 is a cross-sectional side view after performing a second implantation method;

FIG. 7 is a cross-sectional side view after performing a third implantation method;

FIG. 9 is a cross-sectional side view after connecting an additional wiring layer connected through a via on the TSV.

DETAILED DESCRIPTION

Alkali metals ions, for example, sodium ($Na^+$) and potassium ($K^+$) ions, may exist in dielectric layers of back-end-of-line (BEOL) semiconductor devices. Sodium ions, for example, may be a component of silicon dioxides when sodium oxides are mixed with silicon dioxide to form glasses. Because it is energetically favorable for oxygen to bond to silicon, sodium atoms are left as ions within the matrix. Small positively charged ions move readily through thermal oxides under the influence of electric fields, even at room temperature. Small positively charged ions cannot penetrate the silicon lattice and thus may accumulate at the interface as mobile contaminants, which may lead to a net charge transfer and an undesirable change in the threshold voltage of the device.

Other impurities may include metals, for example iron, nickel, and copper, that remain after processes used to fabricate interconnect levels, such as chemical mechanical polishing (CMP). However, the impurities may include any ion, compound, or material that is detrimental to the operation of the semiconductor device formed in the substrate.

The TSV formation process includes etching a deep trench from the BEOL through the front-end-of-line (FEOL). Although a layer of silicon nitride may form a protective barrier to prevent mobile ion contaminants from moving from the BEOL to the FEOL, forming the TSV trench may result in introducing the unwanted impurities into the substrate along sidewalls of the TSV trench. More specifically, the impurities may contaminate the substrate by diffusing into dielectric materials, such as, for example a dielectric TSV liner or a buried oxide layer of a silicon-on-insulator (SOI) substrate within the substrate.

Figure 1:
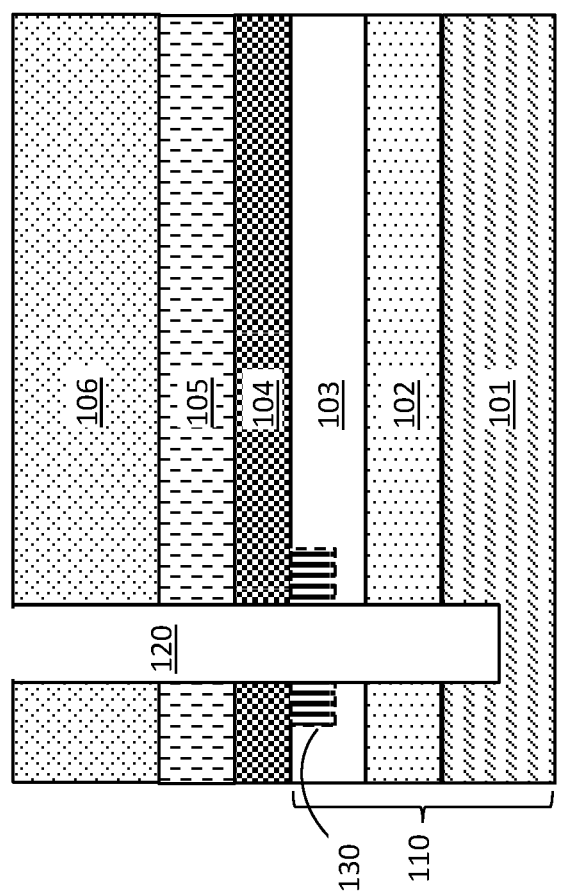
FIG. 1 is a device with a shallow anticipatory implant positioned within a substrate in contact with a TSV trench.

One method for reducing substrate 110 contamination during TSV formation is to use an anticipatory implant that getters the contaminating ions, as shown in FIG. 1. Gettering is a process in which unwanted impurities are removed from an undesired area by providing an alternative location (a "getter") where they prefer to reside, or where their energy is lower. Gettering is used to remove unwanted ions, materials, and compounds by segregating them from the active device areas to a confined area where they cannot cause damage or have a negative impact on the device. Dopants may be incorporated into a predetermined area of the substrate to getter contaminants.

Referring again to FIG. 1, the substrate 110 may be, for example, a silicon-on-insulator (SOI) with a base semiconductor substrate 101, a buried dielectric layer 102 formed on the base semiconductor substrate 101, and a SOI layer 103 formed on the buried dielectric layer 102. A dopant designed to function as a gettering agent once incorporated into the substrate 110 that limits or prevents impurity diffusion may be introduced into the substrate 110 in a shallow region 130 of the substrate 110. The shallow region 130 of the substrate 110 that is implanted with the dopant may then react with impurity elements of the substrate 110 as a gettering agent that attracts impurities and prevents or limits their diffusion into the substrate 110. However, one challenge of using the anticipatory implant shown in FIG. 1 is that the implanted region 130 is shallow, for example, about 0.1 to about 0.5 microns thick, while the TSV trench 120 through the interconnect level 106, barrier layer 105, dielectric layer 104, and substrate 110 is deep, for example, about 55 microns deep. Thus contaminating ions may easily move along the oxygen sidewall of the TSV trench 120 and into, for example, the buried dielectric layer 102.

Accordingly, various embodiments provide methods for making 3D chip assemblies, and more particularly to an angled implant technique, in contrast to the confined shallow implant technique shown in FIG. 1, to reduce substrate contamination during TSV formation. The methods allow for TSV fabrication without contaminating the substrate, and therefore, negatively impacting the operation of the devices. Using an angled implantation technique in which the substrate may be rotated, a dopant is introduced into the substrate before etching the TSV trench to form an angled implant. Multiple angles and rotations may be used to optimize or mitigate shadowing by the patterning mask positioned over the substrate. Once incorporated into the substrate and around the TSV, the dopant functions as a gettering agent to limit or prevent the diffusion of impurities into the substrate and prevent contamination of the substrate, which is described in further detail below. Compared to a shallow implant, for example, as shown in FIG. 1, the angled implant provides the ability to getter impurities over the entire depth of the TSV. Further, the methods are less costly and complex than eliminating mobile ions from the back-end-of-line (BEOL) and do not need an additional TSV exclusion zone.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

Turning again to the Figures, FIGS. 2A-9 illustrate exemplary methods of making semiconductor structures according to various embodiments. FIG. 2A is a cross-sectional side view of a substrate 210. The substrate 210 may include a bulk semiconductor or a layered semiconductor such as Si/SiGe, a silicon-on-insulator (SOI), or a SiGe-on-insulator (SGOI). Bulk substrate materials may include undoped Si, n-doped Si, p-doped Si, single crystal Si, polycrystalline Si, amorphous Si, Ge, SiGe, SiC, SiGeC, Ga, GaAs, InAs, InP and other III/V or II/VI compound semiconductors. In the embodiment shown in FIG. 2A, a SOI substrate 210 may be used. The SOI substrate 210 may include a base substrate 201, a buried dielectric layer 202 formed on top of the base substrate 201, and a SOI layer 203 formed on top of the buried dielectric layer 202. The buried dielectric layer 202 may isolate the SOI layer 203 from the base substrate 210.

The base substrate 201 may be formed from a semiconductor material such as, for example, silicon, germanium, silicon-germanium alloy, silicon carbide, silicon-germanium carbide alloy, and compound (e.g., III-V and II-VI) semiconductor materials. Non-limiting examples of compound semiconductor materials include gallium arsenide, indium arsenide, and indium phosphide. The base substrate 102 may be, but is not limited to, several hundred microns thick. For example, the base substrate 201 may have a thickness in a range from about 0.5 mm to about 1.5 mm.

The buried dielectric layer 202 may include a dielectric material, for example, an oxide, a nitride, or an oxynitride of silicon. The buried dielectric layer 202 may also include oxides, nitrides and oxynitrides of elements other than silicon. In addition, the buried dielectric layer 202 may include crystalline or non-crystalline dielectric material. Moreover, the buried dielectric layer 202 may be formed using a deposition method, for example, thermal or plasma oxidation or nitridation methods, chemical vapor deposition (CVP) methods, and physical vapor deposition (PVD) methods. The buried dielectric layer 202 may have a thickness ranging from about 5 nm to about 200 nm. In one embodiment, the buried dielectric layer 104 may have a thickness ranging from about 150 nm to about 180 nm.

The SOI layer 203 may include any of the several semiconductor materials included in the base substrate 201. The base substrate 201 and the SOI layer 203 may include either identical or different semiconducting materials with respect to chemical composition and dopant concentration. In one embodiment, the SOI layer 203 may include a thickness ranging from about 5 nm to about 100 nm. In another embodiment, the SOI layer 203 may have a thickness ranging from about 25 nm to about 30 nm. Non-limiting examples of methods for forming the SOI layer 203 include SIMOX (Separation by Implantation of Oxygen), wafer bonding, and ELTRAN® (Epitaxial Layer TRANsfer).

FIG. 2B is a cross-sectional side view after forming transistors on the substrate 210. The SOI layer 203 may be doped, undoped or contain both doped and undoped regions therein. These doped regions are known as "wells" and can be used to define various device regions, for example a source/drain region. The source/drain region, for example, may be either n-doped or p-doped. An n-doped source/drain region may be used to form n-type field effect transistors (nFETs), and a p-doped source/drain region may be used to form p-type field effect transistors (pFETs). However, the source/drain region of one device on a substrate may be n-doped while the source drain regions of another device on the same substrate may be p-doped. In one embodiment, the substrate 210 may include all nFET devices. In another embodiment, the substrate 210 may include all pFET devices. Yet, in another embodiment, the substrate 210 may include some combination of nFET and pFET devices.

With continued reference to FIG. 2B, one or more devices, for example an nFET 211 and a pFET 220, may be formed in the SOI layer 203 of the substrate 210. The nFET 211 and a pFET 220 may be fabricated using any technique, for example, gate first or gate last techniques. Furthermore, the devices may include either a planar structure or a fin structure. In the case of planar devices, as shown, the nFET 211 and the pFET 220 may include a gate formed on top of the SOI layer 203. The gate may further include a pair of dielectric spacers formed by conformally depositing a dielectric, followed by an anisotropic etch that removes the dielectric from the horizontal surfaces while leaving the dielectric on the sidewalls of the gate. The nFET 211 and a pFET 220 may each include a source region and a drain region formed in the SOI layer 203 using an implant technique. The source and drain regions may be formed from doped wells as described above. For purposes of illustration only, the source and drain regions are depicted in the SOI layer 203 immediately adjacent to the pair of spacers of each device. However, the source drain regions may in some cases extend beneath the dielectric spacers or the gate. Alternatively, in one embodiment, the source and drain regions may be raised above the SOI layer 203 (not shown). The structure may also include an isolation structure (not shown) situated between the two devices to electrically insulate them from one another. For example, a shallow trench isolation (STI) structure may be formed in the SOI layer 203 between two adjacent devices. The shallow trench isolation structure may include a trench filled with a dielectric material.

Figure 3:
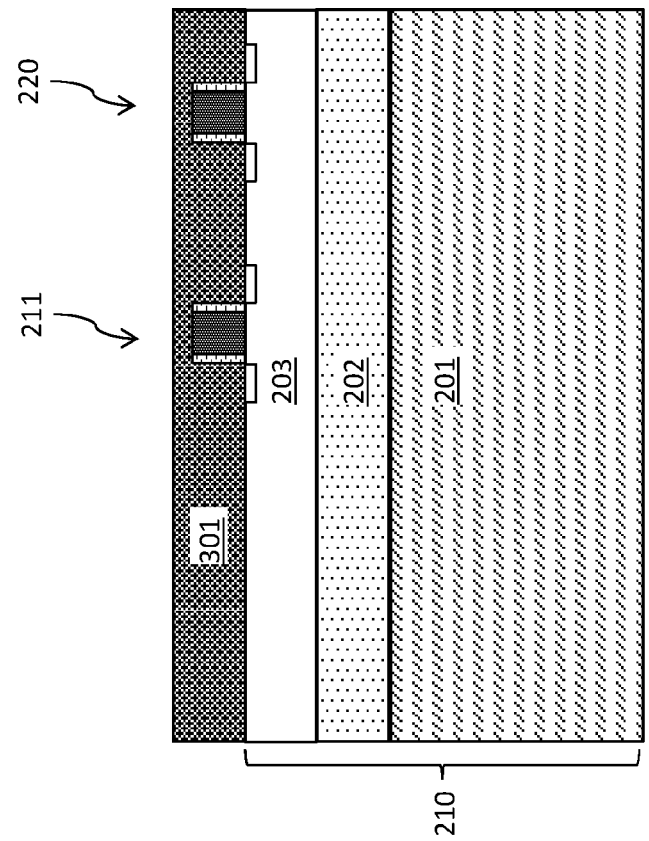

FIG. 3 is a cross-sectional side view after disposing a mask 301 on the substrate 210. Any suitable lithography mask may be applied above the substrate 210. The mask 301 may be, for example, a resist, such a photoresist. The resist may a polymeric spin-on material or a polymeric material. The mask 301 may also be a hard mask material, for example, silicon nitride.

Figure 4:
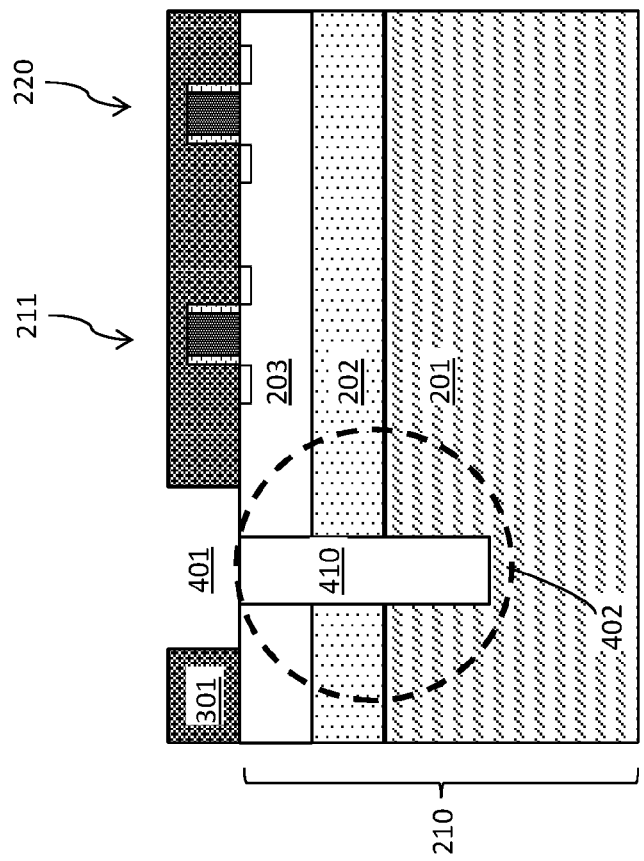

FIG. 4 is a cross-sectional side view after forming a trench 410 (TSV trench) in the substrate 210 and etching the mask 301 to establish one or more openings 401 over the substrate 210. The trench 410 may be formed using known patterning techniques, such as for example, a lithography technique followed by an etching technique. The trench 410 extends through the SOI layer 203, buried dielectric layer 202, and a portion of the base substrate 201. The trench 410 extends about at least 55 microns through the base substrate 201, or about 3 to about 500 microns through the base substrate 201.

Forming the trench 410 in the substrate 210 before performing the angled implantation, described below in FIGS. 5-7, allows for the implantation to penetrate deeper into the substrate 210. Once the trench 401 is formed, the implanted ions can penetrate sidewalls of the trench 410. For example, the implanted ions may penetrate about 0.25 to about 0.5 microns through the sidewalls and the endwall of the trench 410. Thus, the ions implant deeper into the substrate 210 than if the implantation was performed before forming the trench 410.

Although the trench 410 is shown extending through the SOI layer 203, the buried dielectric layer 202, and a portion of the base substrate 201, the trench 410 may only extend through one or more of these layers before implantation. Then the trench 410 may be etched deeper after implantation to form the final TSV.

The opening 401 in the mask 301 may generally define selected areas 402 of the substrate 210 intended to be implanted with a dopant, described in detail in FIGS. 5-7 below. Similarly, the mask 301 may be used to prevent implantation of other selective areas. Further, the openings 401 in the mask 301 may define the source/drain regions of the nFET 211 and/or the pFET 220 by forming additional openings over the source/drain regions (not shown). Alternatively, the source/drain regions of the nFET 211 or pPET 220 may be implanted independently from the areas 402, in which two different masking steps may be used.

Figure 5:
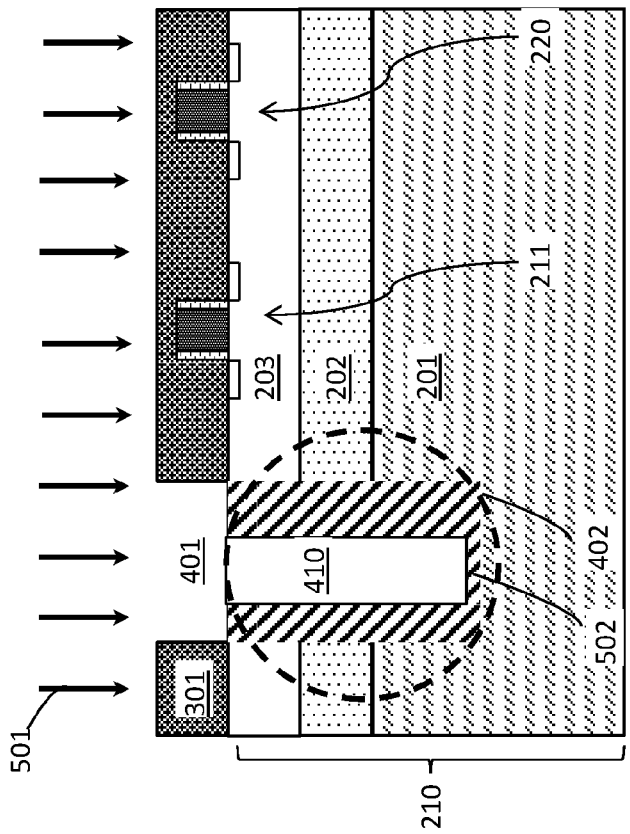

FIG. 5 is a cross-sectional side view after introducing a dopant into the substrate 210 in the area 402 using an implantation technique 501 (first implantation technique). Once incorporated into the substrate 210, the dopant functions forms an implant 502 that getters contaminants in the substrate 210. In other words, the dopant functions as a gettering agent. The substrate 210 is positioned such that the first implantation technique 501 introduces the dopant into at least a portion (first area) of the desired final area 402. As shown in FIG. 5, the substrate 210 may be positioned substantially perpendicular to dopant deposition beam, or the substrate 210 may be positioned substantially normal to the implantation beam. The area 402 defines an area in which the TSV will be formed. The area 402 where the getter will be formed has a diameter that is larger than the final width of the TSV.

The implant technique may include, but is not limited to, ion implantation, gas phase doping, plasma doping, plasma immersion ion implantation, cluster doping, infusion doping, liquid phase doping, solid phase doping, or any combination thereof.

The gettering agent formed in the substrate 210 may be an element or compound that will attract impurities present in the substrate 210, for example, metals, such as copper, and other ions, such as sodium or potassium, and prevent their diffusion. Non-limiting examples of dopants that function as gettering agents once implanted in the substrate 210 include arsenic, phosphorus, boron, halogens (e.g., fluorine, chlorine, bromine, etc.), any combination thereof. When arsenic is used as the dopant, for example, the arsenic may react with silicon and oxygen in the substrate 110 to form a negatively charged ion that functions as a gettering agent. Non-limiting examples of gettering agents include negatively charged ions, for example, ions including arsenic ions, fluorine ions, chlorine ions, etc. In some embodiments, the gettering agent is a negatively charged species that attracts positively charged impurities, for example, sodium and/or potassium, and limits their diffusion into the substrate 210.

In some embodiments (not shown), arsenic may be used to simultaneously implant the source/drain regions of an nFET device 211 and the area 402. The area 402 and the source/drain regions of the nFET device 211 may be implanted with arsenic at the same time using the same implant technique. Therefore, implanting the area 402 with arsenic may be accomplished without any additional steps, and while using current fabrication process flows. In one embodiment, phosphorous may be used as the dopant and may have a similar effect as arsenic described above.

The concentration of the dopant used to form the implant 502 may generally vary. In one embodiment, the dopant concentration may in a range from about $1.0 \times 10^{17}/cm^3$ to about $1.0 \times 10^{20}/cm^3$.

Figure 6:
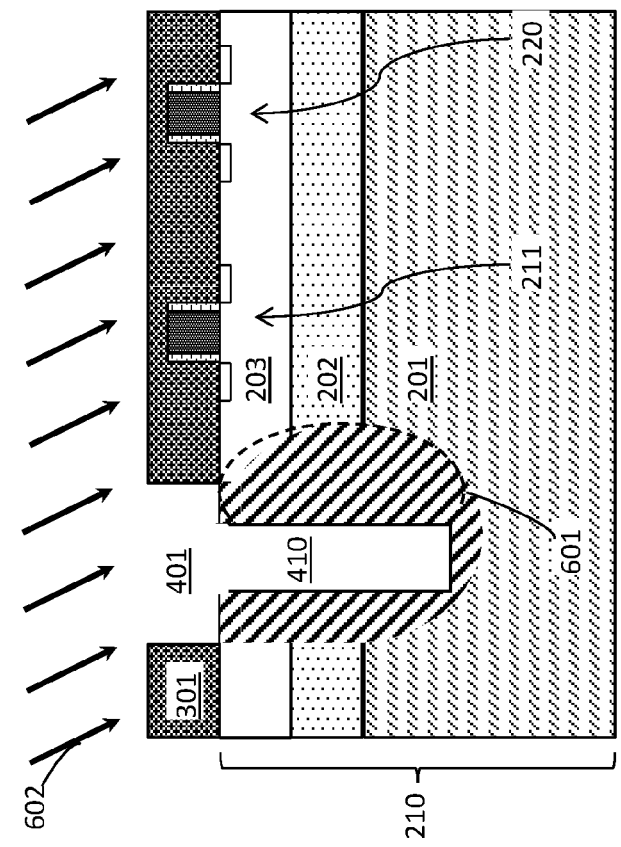

FIG. 6 is a cross-sectional side view after performing a second implantation technique with the mask 301 in place. The dopant is incorporated into a different area 601 (second area) of the substrate 210 to form an angled implant. The dopants form the gettering agent positioned along a sidewall of where the TSV will be formed. The second implantation may be performed by rotating the substrate 210 at an angle with respect to the implantation beam 602. Alternatively, the implantation beam 602 may be angled with respect to the substrate 210. The substrate 210 may also be rotated to position the substrate 210 at an oblique angle with respect to a normal axis of the substrate 210 during the first implantation technique.

Figure 7:
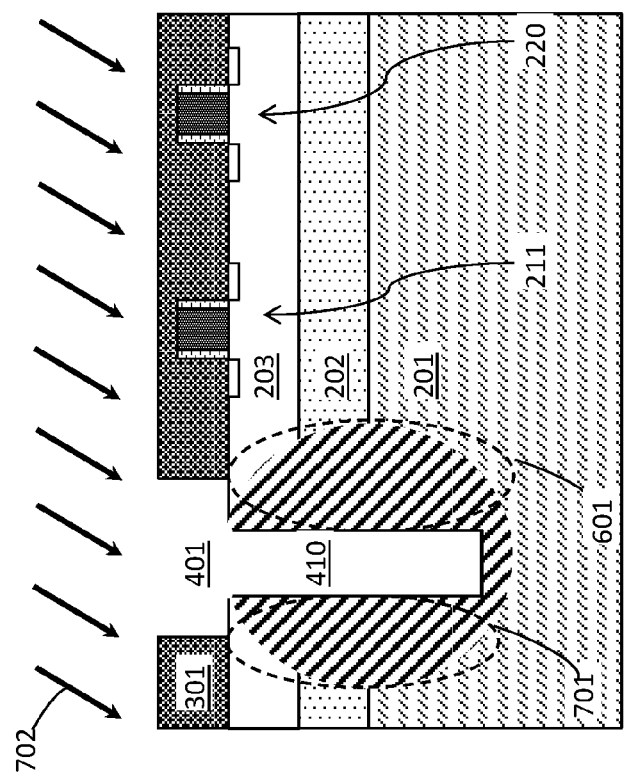

FIG. 7 is a cross-sectional side view after performing another implantation technique (third implantation) with the mask 301 in place. The implantation may be performed by rotating the substrate 210 at an angle with respect to the implantation beam 702. Alternatively, the implantation beam 702 may be angled with respect to the substrate 210.

Although two angled implantations are shown in FIGS. 6 and 7, with the first implantation being performed substantially normal to the implantation beam, any number of rotations and/or angled implantation steps may be performed, provided that the dopant is deposited to a depth and within areas that will surround the TSV that will be formed. The dopant should be deposited in the substrate to form an implant that extends from a surface of the substrate 210 and through the substrate 210 to surround the TSV.

After depositing the dopant, one or more thermal processes may be performed. For example, performing an activation annealing technique may increase the temperature. These thermal processes may encourage the diffusion of the implanted ions, the dopant, and thus may affect the concentration and depth.

Figure 8A:
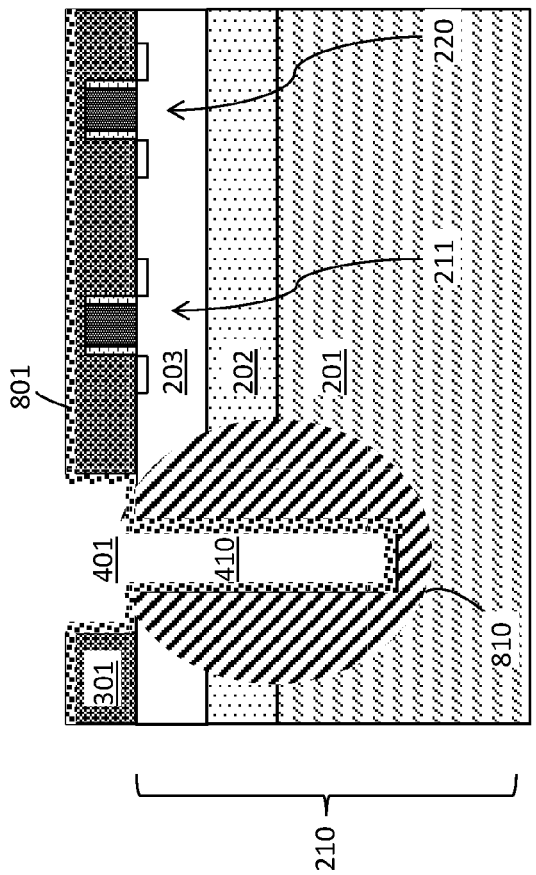
FIG. 8A is a cross-sectional side view after depositing a dielectric layer in the trench.

FIG. 8A is a cross-sectional side view after depositing a dielectric layer 801 in the trench 401. The dielectric layer 801 is disposed along sidewalls and the endwall of the trench 401. The dielectric layer 801 is also disposed on the surface of the mask 301. The implant 810 surrounds all sidewalls and the endwall of the trench 410 (TSV). The gettering ions may extend about 0.25 to about 0.5 microns through the substrate 210 from the sidewalls and endwall of the trench 410.

The dielectric layer 801 may be a low-k dielectric material (with k<4.0), including but not limited to, silicon oxide, spin-on-glass, a flowable oxide, a high density plasma oxide, borophosphosilicate glass (BPSG), or any combination thereof. The dielectric layer may be deposited by a deposition process, including, but not limited to CVD, PVD, plasma enhanced CVD, atomic layer deposition (ALD), evaporation, chemical solution deposition, or like processes.

Figure 8B:
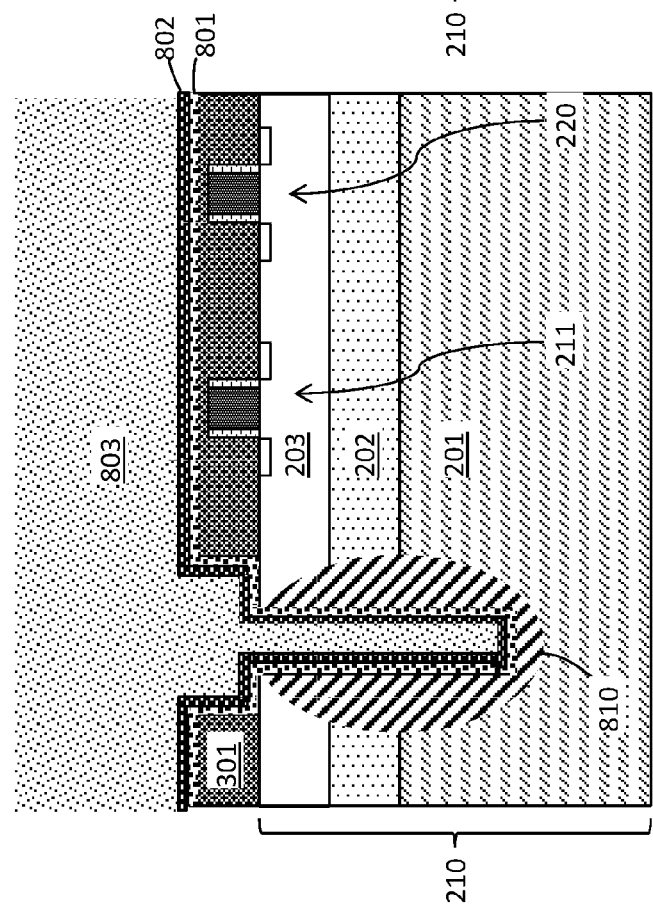
FIG. 8B is a cross-sectional side view after depositing a liner on the dielectric layer and a metal to fill the trench.

FIG. 8B is a cross-sectional side view after depositing a liner 802 on the dielectric layer 801 and a metal 803 to fill the trench 401 and form the final TSV. The liner 802 improves adhesion of the metal 803. The liner 802 may include a metallic compound. The liner 802 may include, for example, tantalum nitride (TaN), followed by an additional layer including tantalum (Ta). Other barrier liners may include cobalt (Co), or ruthenium (Ru) either alone or in combination with any other suitable liner. The liner 802 material may be deposited by a chemical vapor deposition process (CVD), atomic layer deposition (ALD), or other suitable process.

The metal 803 filling the trench forms a wiring level. The metal 803 may include, for example, copper (Cu), aluminum (Al), or tungsten (W). The metal 803 may be formed using a filling technique such as electroplating, electroless plating, CVD, PVD, or a combination thereof.

Figure 9:
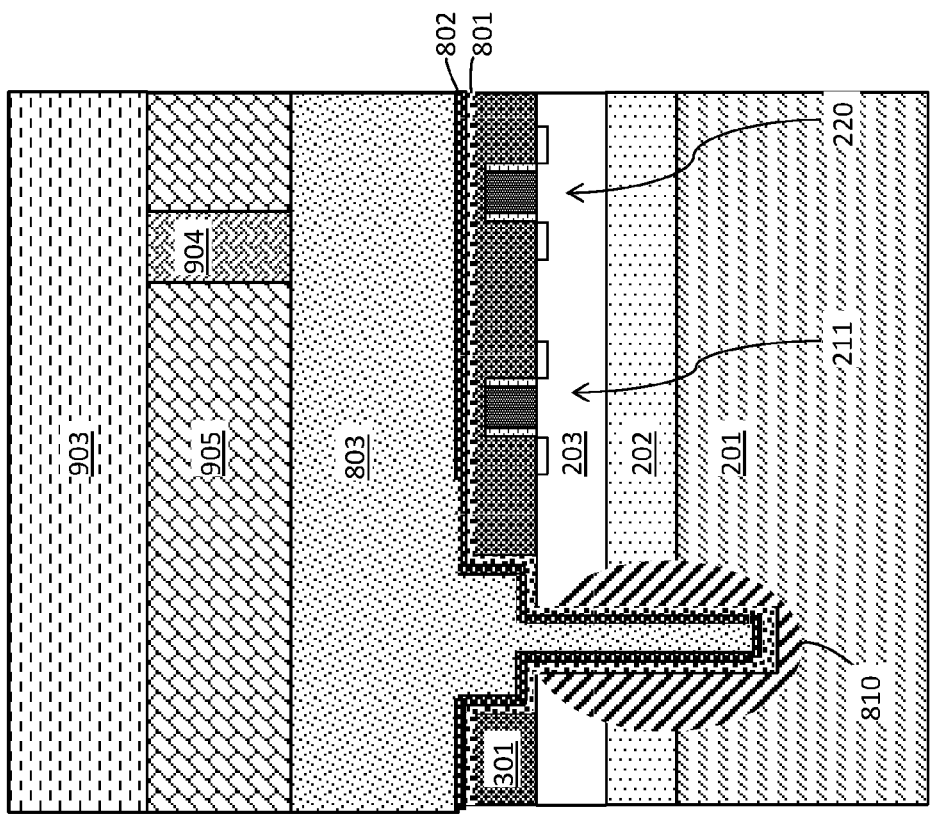

FIG. 9 is a cross-sectional side view after connecting an additional wiring level 903 through a via 904. One or more additional wiring levels (interconnect levels) may be fabricated above the wiring level formed by metal 803. The via 904 is formed between wiring level (metal 803) and wiring level 903 within an insulating material, also referred to as an inter-level dielectric (ILD 905).

The ILD 905 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 905 may be deposited by a deposition process, including, but not limited to CVD, PVD, plasma enhanced CVD, atomic layer deposition (ALD), evaporation, chemical solution deposition, or like processes. The vertical via 904 is patterned and etched in the ILD 905 before disposing the additional wiring level 903.

It is noted that the structure shown in FIG. 9 is not drawn to scale. Wiring level formed by metal 803 and the wiring level 903 are generally less than 1 micron thick. Although, the wiring levels may have thicknesses that are more or less than 1 micron.

Although formation of the TSV provides a direct path the metal 803 in the wiring level to access the substrate 210, the implant 810 with the gettering agent will remove any impurities that diffuse through the substrate 210.

Because the implant 810 surrounds all sidewalls of the trench 401, the angled implant attracts more impurities than an implant confined to a shallow area, for example, as shown in FIG. 1. The angled implant 810 traps impurities from all levels of the substrate 210, including the base substrate 201, buried dielectric layer 202, and SOI layer 203, in contrast to the shallow implant in FIG. 1 that may only trap impurities from the SOI layer 103.

The angled implant 810 has a width that is larger than the TSV. In some embodiments, TSV has a width in a range from about 0.2 to about 25 microns. Yet in other embodiments, the TSV has a width in a range from about 6 to about 25 microns.

As described above, various embodiments provide methods for making 3D chip assemblies, and more particularly to an angled implant technique, in contrast to the confined shallow implant technique shown in FIG. 1, to reduce substrate contamination during TSV formation. The methods allow for TSV fabrication without contaminating the substrate, and therefore, negatively impacting the operation of the devices. Using an angled implantation technique in which the substrate is rotated, a dopant is introduced into the substrate before etching the TSV trench to form an angled implant. Multiple angles and rotations may be used to optimize or mitigate shadowing. The dopant functions as a gettering agent to limit or prevent the diffusion of impurities into the substrate and prevent contamination of the substrate. Compared to a shallow implant, for example, as shown in FIG. 1, the angled implant provides the ability to getter impurities over the entire depth of the TSV. Further, the methods are less costly and complex than eliminating mobile ions from the back-end-of-line (BEOL) and do not need an additional TSV exclusion zone.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a semiconductor device, the method comprising:
    disposing a mask on a substrate;
    etching the mask to form an opening in the mask;
    etching a trench in the substrate beneath the opening in the mask;
    implanting a dopant, by an implantation technique, in an area of the substrate beneath the opening of the mask such that the dopant extends within the substrate from a substantially vertical sidewall of the trench and substantially horizontal bottom endwall of the trench, the dopant capable of gettering mobile ions that can contaminate the substrate; and
    simultaneous with implanting the dopant, implanting a source/drain region of an nFET device adjacent the trench with an element selected from the group consisting of arsenic and phosphorous.

2. The method of claim 1, further comprising filling the trench with a conductive material to form a through-silicon via (TSV).

3. The method of claim 1, wherein the dopant comprises arsenic, phosphorus, or a combination thereof.

4. The method of claim 1, wherein the substrate comprises a base semiconductor substrate, a buried dielectric layer disposed on the base semiconductor substrate, and a silicon layer disposed on the buried dielectric layer.

5. The method of claim 4, wherein the trench extends about 3 to about 500 microns through the base semiconductor substrate.

6. The method of claim 1, wherein the dopant getters ions by segregating the ions away from active device areas.

7. The method of claim 1, wherein the dopant extends through the substrate about 0.25 to about 0.5 microns from the sidewall of the trench.

8. The method of claim 1, wherein the dopant extends through the substrate about 0.25 to about 0.5 microns from the endwall of the trench.

9. A method of making a semiconductor device, the method comprising:
    disposing a mask on a substrate;
    etching the mask to form an opening in the mask;
    etching a trench in the substrate beneath the opening in the mask;
    performing a first implantation technique, after etching the trench, to introduce a dopant in a first area of the substrate beneath the opening of the mask, the dopant capable of gettering mobile ions that can contaminate the substrate;
    during the first implantation technique, implanting a source/drain region of an nFET device adjacent the trench with an element selected from the group consisting of arsenic and phosphorous;
    performing a second implantation technique, after performing the first implantation technique, to introduce a dopant in a second area of the substrate beneath the opening of the mask, a portion of the second area being different than the first area, and the dopant capable of gettering mobile ions that can contaminate the substrate;

wherein the dopant extends within the substrate from a substantially vertical sidewall of the trench and a substantially horizontal bottom endwall of the trench.

10. The method of claim 9, wherein the ions are sodium ions or potassium ions.

11. The method of claim 9, wherein the ions are copper ions.

12. The method of claim 9, wherein the dopant getters ions by segregating the ions away from active device areas.

13. The method of claim 9, wherein performing the second implantation technique comprises rotating the substrate to position the substrate at an oblique angle with respect to a normal axis of the substrate during the first implantation technique.

14. The method of claim 13, further comprising rotating the substrate to position the substrate at another oblique angle and performing a third implantation technique to introduce the dopant in a third area of the substrate, the third area being different than the first or second areas.

* * * * *